(12) United States Patent
Hussein (10) Patent No.: US 11,626,907 B2
(45) Date of Patent: *Apr. 11, 2023

(54) RADIO FREQUENCY GENERATORS, AND RELATED SYSTEMS, METHODS, AND DEVICES

(71) Applicant: Analogic Corporation, Peabody, MA (US)

(72) Inventor: Ahmed A. Hussein, Burlington, MA (US)

(73) Assignee: Analogic Corporation, Peabody, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/731,563

(22) Filed: Dec. 31, 2019

(65) Prior Publication Data

US 2020/0403657 A1 Dec. 24, 2020

Related U.S. Application Data

(60) Provisional application No. 62/872,142, filed on Jul. 9, 2019, provisional application No. 62/863,753, filed on Jun. 19, 2019.

(51) Int. Cl.
*H04B 7/0417* (2017.01)
*H03F 1/02* (2006.01)
*G06K 7/10* (2006.01)

(52) U.S. Cl.
CPC ....... *H04B 7/0417* (2013.01); *G06K 7/10009* (2013.01); *H03F 1/0222* (2013.01); *H03F 2200/451* (2013.01)

(58) Field of Classification Search
CPC ............. H04B 7/0417; G06K 7/10009; H03F 1/0222; H03F 2200/451; H01J 37/32146; H01J 37/32174; H03G 3/3042
See application file for complete search history.

(56) References Cited

U.S. PATENT DOCUMENTS

| | | | | |
|---|---|---|---|---|
| 6,307,593 B1* | 10/2001 | Bowyer | ................ | H04N 7/087 348/192 |
| 6,472,822 B1* | 10/2002 | Chen | ................. | H01J 37/32082 315/111.21 |
| 2005/0159118 A1* | 7/2005 | Jin | ...................... | H04W 52/343 455/127.2 |
| 2009/0041169 A1* | 2/2009 | Fujita | .................. | H04L 25/4902 375/354 |
| 2009/0137212 A1 | 5/2009 | Belotserkovsky | | |
| 2009/0276813 A1* | 11/2009 | Bleiweiss | .............. | H04N 19/61 725/82 |
| 2013/0222055 A1 | 8/2013 | Coumou et al. | | |
| 2015/0207464 A1* | 7/2015 | Yamanouchi | ............. | H03F 3/68 375/297 |

(Continued)

Primary Examiner — Syed Haider
(74) Attorney, Agent, or Firm — TraskBritt (57) ABSTRACT

Radio frequency (RF) generators are disclosed. A RF generator may include a modulator configured to receive an arbitrary waveform and an RF carrier, and generate a pulsed radio frequency (RF). The arbitrary waveform may be generated via an analog signal generator external to the RF generator. Further, the RF generator may include an amplification stage configured to amplify the pulsed RF signal. RF generation systems and methods of generating a pulsed RF signal also disclosed.

18 Claims, 10 Drawing Sheets

(56) References Cited

U.S. PATENT DOCUMENTS

| | | | |
|---|---|---|---|
| 2016/0028566 A1* | 1/2016 | Ishida | G01S 13/106 |
| | | | 375/238 |
| 2016/0163514 A1 | 6/2016 | Fisk et al. | |
| 2016/0164240 A1* | 6/2016 | Boland | G02F 1/37 |
| | | | 359/238 |
| 2016/0270725 A1 | 9/2016 | Gray et al. | |
| 2017/0054418 A1* | 2/2017 | Coumou | H03F 3/245 |
| 2017/0180000 A1 | 6/2017 | Yensen et al. | |
| 2017/0180837 A1 | 6/2017 | Kamon et al. | |
| 2018/0364321 A1* | 12/2018 | Nakamura | G01R 33/3607 |
| 2020/0052669 A1* | 2/2020 | Nishihara | H03F 3/19 |
| 2020/0402765 A1 | 12/2020 | Hussein | |

* cited by examiner

RADIO FREQUENCY GENERATORS, AND RELATED SYSTEMS, METHODS, AND DEVICES

CROSS-REFERENCE TO RELATED APPLICATION

This application claims the benefit under 35 U.S.C. § 119(e) of U.S. Provisional Patent Application Ser. No. 62/863,753, filed Jun. 19, 2019, and U.S. Provisional Patent Application Ser. No. 62/872,142, filed Jul. 9, 2019, the disclosures of each are hereby incorporated herein in its entirety by this reference.

FIELD

The present disclosure relates generally to radio frequency (RF) signal generation, and more specifically, to generating a pulsed RF signal having an envelope of arbitrary, multi-step, or single-step pulses of any shape, yet further embodiments relate to RF plasma generation using such pulsed RF signals.

BACKGROUND

In a plasma semiconductor manufacturing processes, a radio frequency (RF) generator is used in capacitively or inductively coupled plasma generation as an RF excitation source as part of the plasma semiconductor manufacturing process. A pulsed RF signal is typically used in a plasma semiconductor manufacturing process to control etch and/or deposition profiles. Typically, performing pulsed RF in a plasma semiconductor manufacturing processes involves feeding pulses created by an external pulsed signal generator via an external connector (Pulse In) to the RF generator. The signal generator is typically a stand-alone piece of equipment, and it has limited waveform options. Another standard pulsing technique may include on/off, single step RF pulsing that is created internal to the RF the generator.

DETAILED DESCRIPTION

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawing could be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP, FPGA and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein "arbitrary waveform" and "arbitrary shape" each mean that the waveform or shape, as the case may be, is a user defined shape.

Some embodiments relate, generally, to an RF generator that is configured to modulate, or pulse, an RF signal using a pulsing waveform (i.e., the modulating signal) and output a pulsed RF signal. According to various embodiments, an envelope of the pulse RF signal may follow the modulating signal waveform. In at least one embodiment, the RF generator is configured to modulate/pulse an RF carrier using a modulating signal having an arbitrary waveform. An arbitrary pulsing waveform may comprise one or more types of pulses, wherein each pulse may have an N-step shape, arbitrary shape, or any other shape. As non-limiting examples, a shape of a pulse may be arbitrary in terms of number of steps, ramp up and down periods, pulse width, amplitude, a random shape, or any combination thereof. As further non-limiting examples, a pulsed waveform may be arbitrary because a waveform of a first pulse period and a waveform of a second pulse period have different shapes.

Further, some embodiments relate, generally, to a pulsed RF generator that is configured to receive and/or store one or more pulse waveforms, and generate a pulsed analog RF signal having the envelope of the pulse waveform. In one embodiment, a pulsing (RF modulating) waveform may be generated at a computer (e.g., using simulation software such as MATLAB or MS Excel, without limitation), and a waveform file may be loaded onto, and possibly stored on, the RF generator for use by the RF generator to generate a pulsed output RF signal. It will be appreciated that for such embodiments, a user may create pulsed waveforms having multi-step, single-step, arbitrary, or any other shape for use by the RF generator to pulse the generator RF output. In embodiments where the RF generator is configured to store multiple pulsed waveforms, the pulsing waveforms may be selectable by a user using an interface and/or a computer operatively coupled to the RF generator by a data port. In other words, a user may select a waveform to use to generate a pulsed RF analog signal for use as a modulating signal. It will be appreciated that for such embodiments, a user is not limited to using a single or just a few pulsed waveforms with an RF generator, but many.

As a non-limiting example of a contemplated use case, a manufacturer of semiconductor manufacturing equipment that includes one or more embodiments of pulsed RF generators disclosed herein may create an arbitrary pulsed waveform (e.g., a single-period of an arbitrary pulsed waveform) on a computer. The semiconductor manufacturer may load the pulsing waveform onto the RF generator through, for example, an interface of the RF generator. In some embodiments, the interface is an interface board with data bus, memory, and/or a microprocessor, without limitation. As non-limiting examples, the interface board may use an RS232 serial interface, an analog interface, a deviceNet interface, profibus interface, CAN open interface, EtherCAT, an Ethernet Interface, or a custom interface, without limitation, to communicate with the computer. The RF generator may read the single-period arbitrary pulsing waveform via the interface, and use the single-period to stitch a continuous arbitrary pulsed waveform that may be used to generate a modulating signal for modulating an RF signal to create an arbitrary pulsed RF signal (e.g., a pulsed RF signal with an arbitrary waveform).

In some embodiments, a stored pulsed waveform may include power level information at each waveform point. In these embodiments, during a contemplated operation, a digital or analog controlled feedback loop of a power generator may use the stored power level information to regulate a power level of a generated pulsed RF signal. In disclosed embodiments, any suitable digital or analog controlled feedback loop may be used, such as, for example, a digital proportional-integral-derivative (PID) controller or an analog PID controller, without limitation.

Various embodiments may provide for precise control of peak power at each pulse step, in single, multi-step, or arbitrary pulsed RF output. Having the ability to regulate the power level at each step (e.g., with a complicated PID controller that controls the set point at each step) is unique.

In some embodiments, a single-period pulsed waveform may be obtained by stitching together two or more stored single-period pulsed waveforms. In one use case, when selecting a stored pulsed waveform to use for pulse RF signal generation, a user may select two or more stored waveforms, and select the combination of the two or more waveforms, or select parts of the waveforms and select the combination of the parts of the waveforms, and obtain a pulsed RF waveform that is the combination of the two or more waveforms.

As described more fully below, according to some embodiments (e.g., such as the embodiments of FIGS. 1A, 2A, and 3A), a mixer may be used to modulate a RF signal. In other embodiments (e.g., such as the embodiments of FIGS. 1B, 2B, and 3B), a power set point may be used to modulate a RF signal.

Figure 1A:
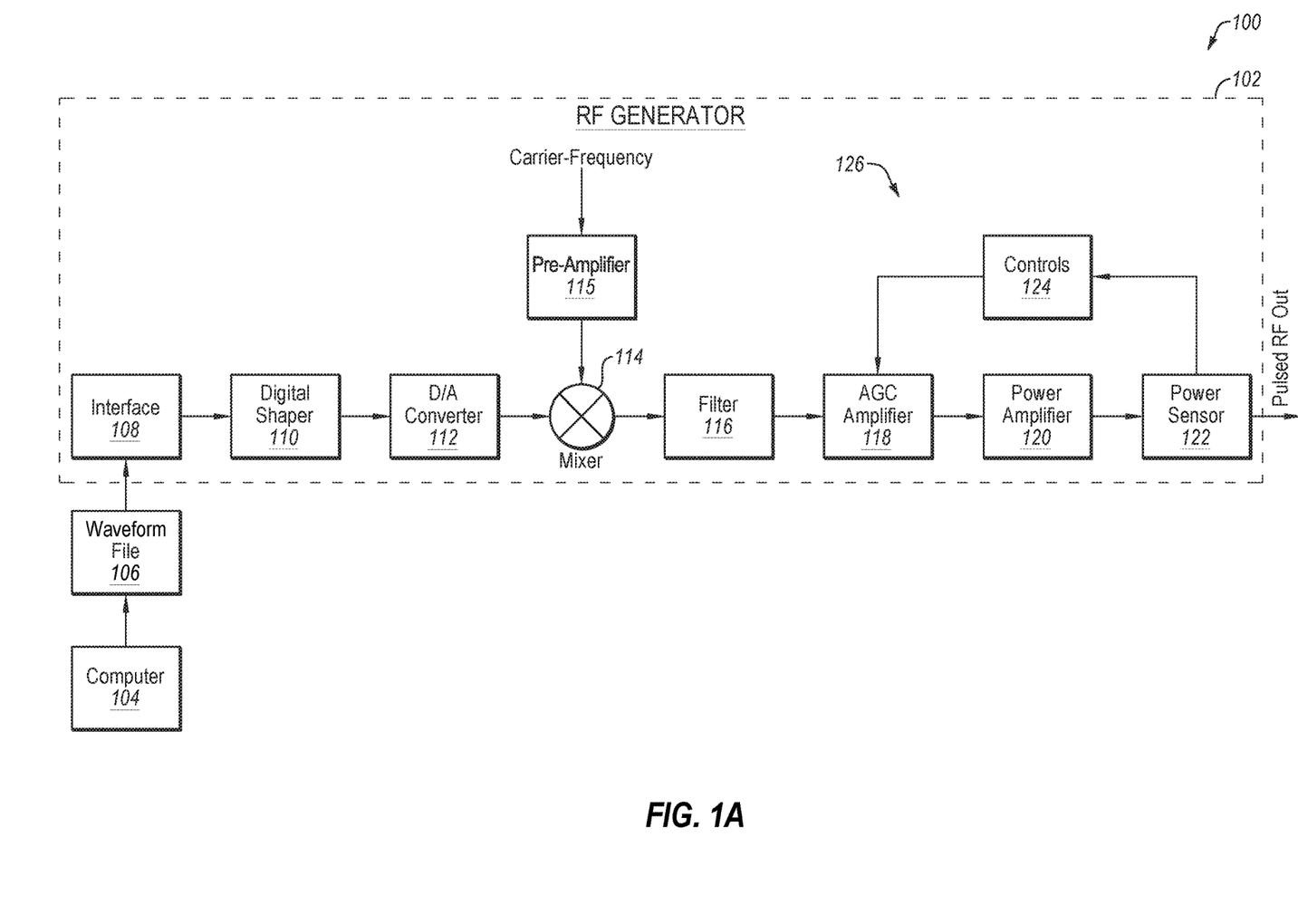
FIG. 1A is a block diagram of an example RF generation system, in accordance with a number of embodiments of the present disclosure.

FIG. 1A depicts an example RF generation system 100, in accordance with disclosed embodiments. RF generation system 100 includes an RF generator 102 configured to receive and/or store waveforms for generating a pulsed RF signal. RF generation system 100 further includes a computer 104 and a waveform file 106.

RF generator 102 includes an interface 108, a digital shaper 110, a digital-to-analog (D/A) converter 112, a mixer 114, a pre-amplifier 115, and a filter 116. RF generator 102 further includes an automatic gain control (AGC) amplifier 118, a power amplifier 120, a power sensor 122, and a control unit 124. In some embodiments, RF generator includes a feedback loop 126. Further, AGC amplifier 118 and/or power amplifier 120 may be part of an amplification stage.

In a contemplated operation, a user may create an arbitrary pulsed waveform (e.g., via computer 104), and waveform file 106 for the arbitrary pulsed waveform may be provided to from computer 104 to RF generator 102 via interface 108. A digital representation of the arbitrary pulsed waveform may be received at digital shaper 110, which is configured to stitch the single-period waveform into a continuous pulsed waveform and output a digital stream representative of the continuous pulsed waveform. D/A converter 112 generates an analog signal having the pulsed waveform in response to the digital continuous pulsed waveform received from digital shaper 110. The analog signal is conveyed to mixer 114. Further, a RF signal (e.g., RF carrier signal), generated via, for example, a direct digital synthesizer (DDS) or a crystal oscillator, is received at pre-amplifier 115 and conveyed to mixer 114.

Mixer 114 modulates the RF signal using the analog signal as a modulating signal to generate a pulsed RF signal, which is filtered via filter 116. Further, AGC amplifier 118 attenuates a power level of the pulsed RF signal in response to an error signal generated by via feedback loop 126. Power amplifier 120 amplifies the attenuated pulsed RF signal and outputs an amplified pulsed RF signal. Power sensor 122 samples the amplified pulsed RF signal at some sampling frequency, and outputs the amplified pulsed RF signal ("Pulsed RF Out"). Samples of the amplified RF signal may be conveyed from power sensor 122 to control unit 124. Power sensor 122 may be any suitable power sensor for RF generation applications, including, as non-limiting examples, a directional coupler that takes power samples, or a voltage/current (V/I) sensor that takes voltage samples, and current samples, or any combination thereof, without limitation. In some embodiments, a calibration table may be included (e.g., between power sensor 122 and control unit 124; not shown). In some embodiments, feedback loop 126 compares pre-defined set points (e.g., at control unit 124) to the samples (e.g., after being converted to power or V/I using look up or calibration tables) and generates an error signal indicative of a difference between the power samples and the set points. It is noted that a set point within control unit 124 may be modified to achieve power regulation at different steps.

In some embodiments, AGC amplifier 118 may change the attenuation applied to the power level of the pulsed RF in response to changes to the error signal to regulate power. A PID or any feedback controller (e.g., within feedback loop 126 (e.g., control unit 124)) may modify the set point for each pulse step or arbitrary wave form to regulate peak power and for precise power control at each pulsed RF step or level.

Figure 1B:
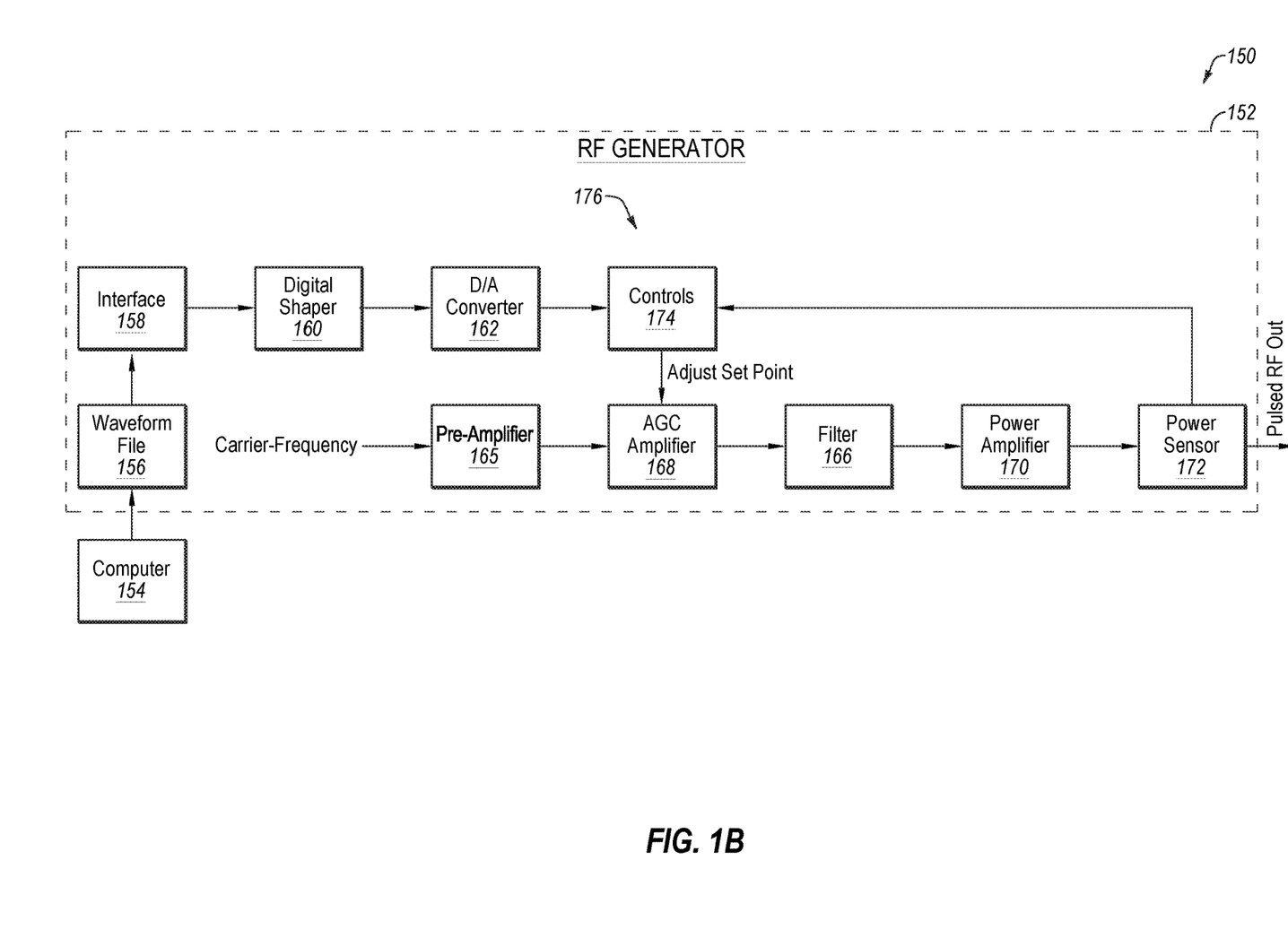
FIG. 1B is a block diagram of another example RF generation system, in accordance with a number of embodiments of the present disclosure.

FIG. 1B depicts another example RF generation system 150, in accordance with disclosed embodiments. RF generation system 150 includes an RF generator 152 and a computer 154. RF generator 152 includes a waveform file 156, an interface 158, a digital shaper 160, and a digital-to-analog (D/A) converter 162. RF generator 150 further includes a pre-amplifier 165, a filter 166, a AGC amplifier 168, a power amplifier 170, a power sensor 172, and a control unit 174. In some embodiments, RF generator 152 includes a feedback loop 176. Further, AGC amplifier 168 and/or power amplifier 170 may be part of an amplification stage.

In a contemplated operation of RF generation system 150, waveform file 156, which may exist on RF generator 152, may be provided to digital shaper 160 via interface 158. For example, a digital representation of the arbitrary pulsed waveform (e.g., of waveform file 156) may be received at digital shaper 160, which is configured to stitch the single-period waveform into a continuous pulsed waveform and output a digital stream representative of the continuous pulsed waveform. D/A converter 162 may generate an analog signal having the pulsed waveform in response to the digital continuous pulsed waveform received from digital shaper 160. The analog signal may be received at control unit 174, which may convey the analog signal to AGC amplifier 268.

A RF signal (e.g., RF carrier signal), generated via, for example, a direct digital synthesizer (DDS) or a crystal oscillator, is received at pre-amplifier 165 and conveyed to AGC amplifier 168. In response to the RF signal, AGC amplifier 168 generates a pulsed RF signal, which is filtered via filter 166.

AGC amplifier 168 may attenuate a power level of the pulsed RF signal in response to an error signal generated by via feedback loop 176. Power amplifier 170 amplifies the attenuated pulsed RF signal and outputs an amplified pulsed RF signal. Power sensor 172, samples the amplified pulsed RF signal at some sampling frequency, and outputs the amplified pulsed RF signal ("Pulsed RF Out"). Samples of the amplified RF signal may be conveyed from power sensor 172 to control unit 174. Power sensor 172 may be any suitable power sensor for RF generation applications, including, as non-limiting examples, a directional coupler that takes power samples, or a voltage/current (V/I) sensor that takes voltage samples, and current samples, or any combination thereof, without limitation. In some embodiments, a calibration table may be included (e.g., between power sensor 172 and control unit 174; not shown). Feedback loop 176 compares pre-defined set points (e.g., at control unit 174) to the samples (e.g., after being converted to power or V/I using look up or calibration tables) and generates an error signal indicative of a difference between the power samples and the set points. It is noted that the set point within control unit 174 may be modified to achieve power regulation at different steps.

In some embodiments, AGC amplifier 168 may change the attenuation applied to the power level of the pulsed RF in response to changes to the error signal to regulate power. A PID or any feedback controller (e.g., within feedback loop 176 (e.g., control unit 174)) may modify the set point for each pulse step or arbitrary wave form to regulate peak power and for precise power control at each pulsed RF step or level.

Some embodiments relate, generally, to a pulse generation system where a user may create a pulsed analog signal of arbitrary, multi-step, or single-step pulses of any shape, and provide the pulsed/modulating analog signal directly to an RF generator. The RF generator may use the pulsed analog signal as a modulating signal for modulating an RF carrier and to generate a pulsed RF signal. In various disclosed embodiments, when creating a pulsed signal, a user may control for various pulse characteristics. Non-limiting examples of pulse characteristics include duty cycle, pulse repetition frequency, rise and fall times, and combinations thereof, without limitation. In some embodiments, the user creates a number (e.g., a series) of commands for describing a pulsed waveform having specific pulse characteristics using a syntax recognized by the RF generator. In some embodiments, the RF generator is configured to interpret the commands to create a pulsed signal having a waveform that results from following the commands according to a pre-defined schema. In some embodiments, the RF generator is configured to store the commands, a waveform file defining a single-period of the pulsed analog signal, and/or a digital representation of a single-period of the pulsed analog signal.

In some embodiments, the commands sent to the RF generator may include power level information at each waveform point. In a contemplated operation, a digital or analog controlled feedback loop of a power generator may use the stored power level information to regulate a power level of a generated pulsed RF signal. In disclosed embodiments, any suitable digital or analog controlled feedback loop (e.g., including the feedback loops shown in FIGS. 1A and 1B) may include, for example, a digital proportional-integral-derivative (PID) controller or an analog PID controller, without limitation.

Figure 2A:
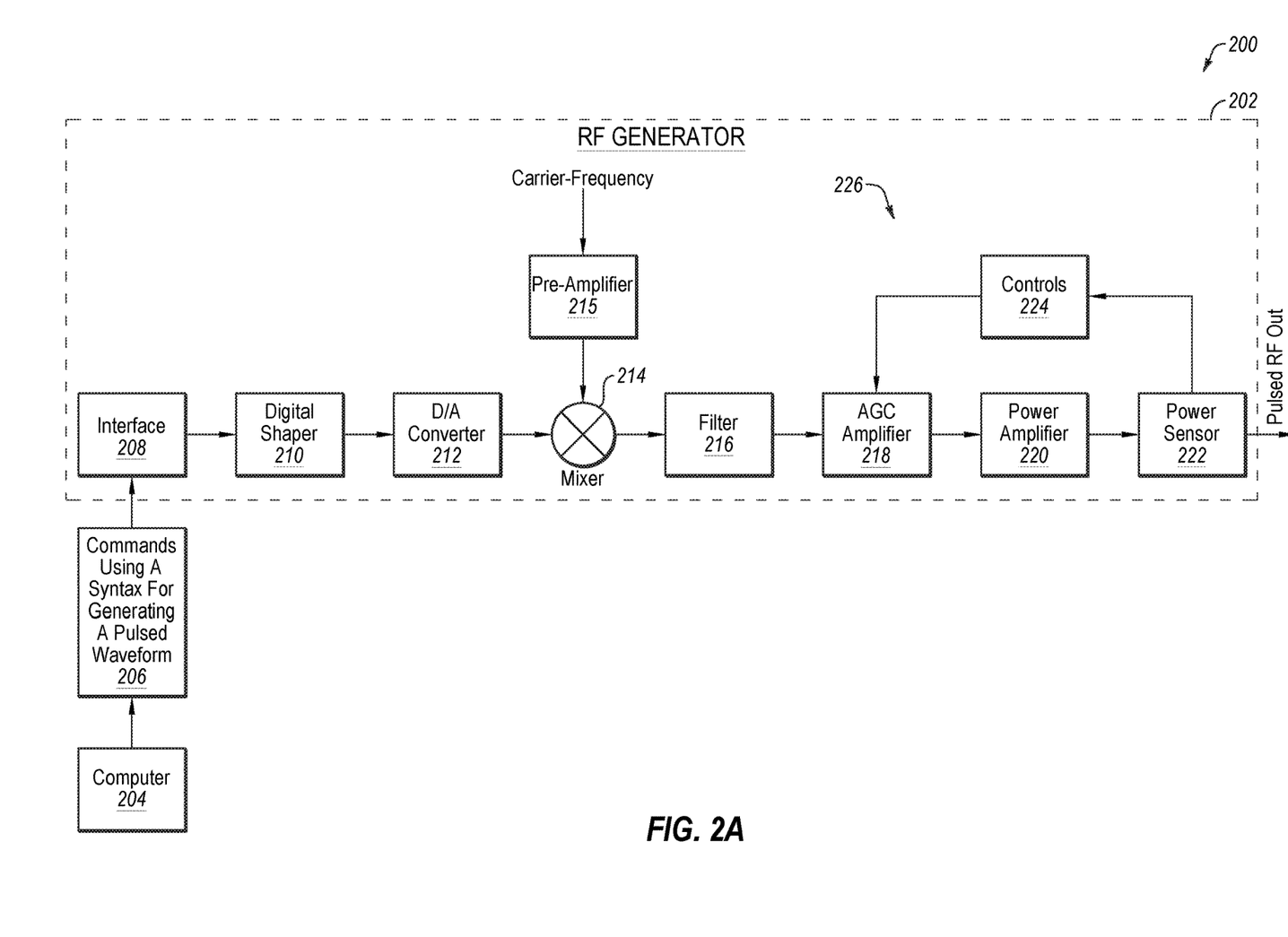
FIG. 2A is a block diagram of another example RF generation system, according to a number of embodiments of the present disclosure.

FIG. 2A shows an embodiment of an example RF generation system 200 including an RF generator 202, according to various embodiments of the disclosure. RF generation system 200 further includes a computer 204 and commands 206, which may include a series (e.g., one or more) of commands. For example, commands 206 may include commands for describing a pulsed waveform having specific pulse characteristics using a syntax recognized by RF generator 202.

RF generator 202 includes an interface 208, a digital shaper 210, a digital-to-analog (D/A) converter 212, a mixer 214, a pre-amplifier 215, and a filter 216. RF generator 202 further includes a AGC amplifier 218, a power amplifier 220, a power sensor 222, and a control block 224. In some embodiments, RF generator 202 includes a feedback loop 226. Further, AGC amplifier 218 and/or power amplifier 220 may be part of an amplification stage.

In some embodiments, computer 204 is used to generate commands 206 that use a syntax for describing pulse characteristics of a pulsed waveform. Commands 206 may be provided to RF generator 202 via interface (e.g., an interface similar to the interface described with reference to FIGS. 1A and 1B) 208. For example, commands 206 may include power levels and time span for each segment in the pulse span. Commands 206 are received at digital shaper 210, which is configured to interpret the commands to generate a digital representation of a single-period pulsed waveform and to stich the single-period of the pulsed waveform into a continuous pulsed waveform. Digital shaper 210 outputs a bit stream representative of the digital pulsed waveform. D/A converter 212 generates an analog pulsed signal in response to the digital continuous pulsed waveform received from digital shaper 210. The analog pulsed signal may be received at mixer 214.

A RF signal (e.g., an RF carrier signal), generated via, for example, a direct digital synthesizer (DDS) or a crystal oscillator, is received at pre-amplifier 215 and conveyed to mixer 214. Mixer 214 modulates the RF signal using the analog pulsing (modulating) signal and outputs a pulsed RF signal. The pulsed RF signal is filtered via filter 216, and the filtered RF signal is amplified via AGC amplifier 218 to output an amplified pulsed RF signal. The level of attenuation is controlled by a controlled feedback loop (i.e., including control block 224) 226, similar to as described above with reference to FIGS. 1A and 1B.

Figure 2B:
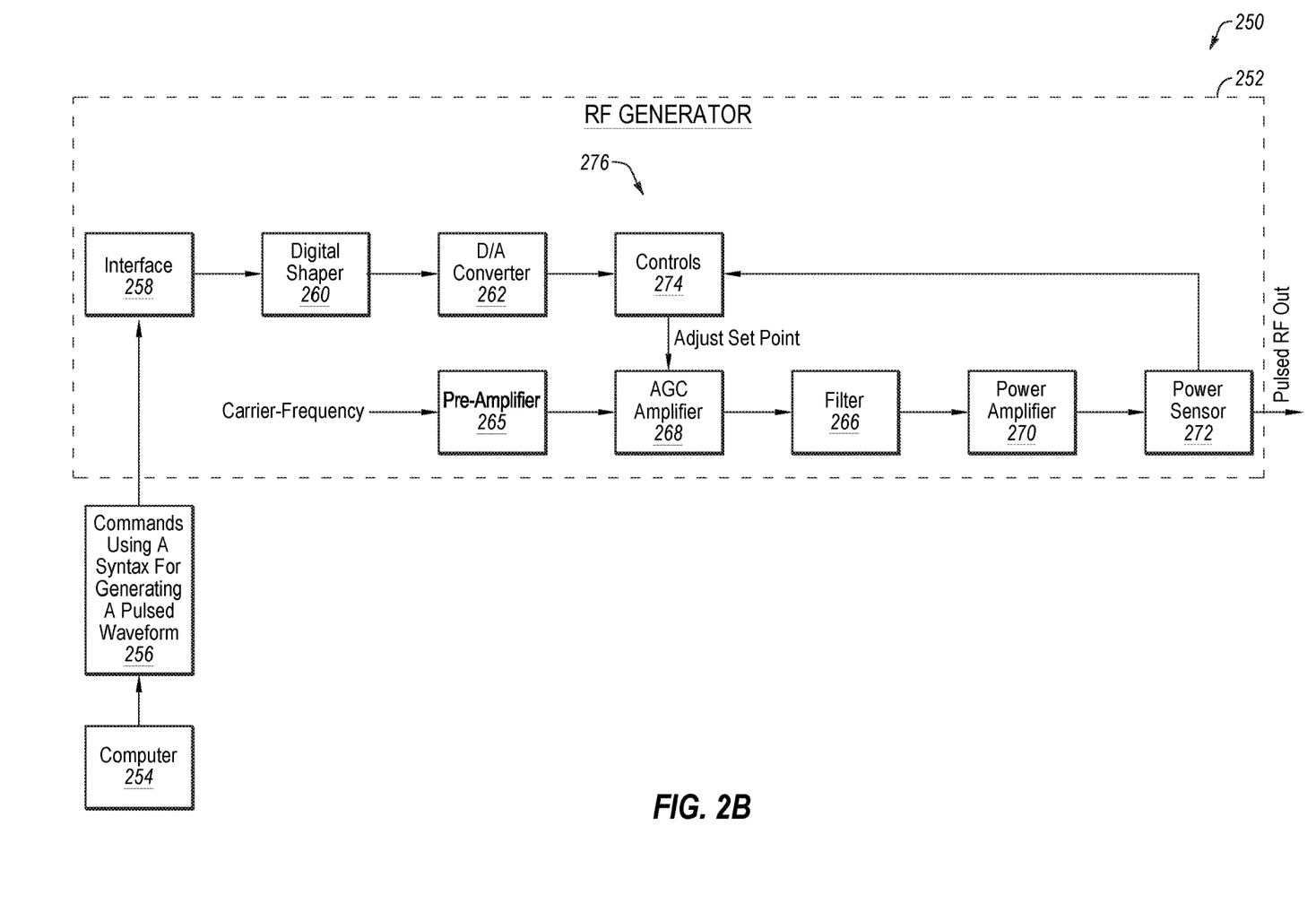
FIG. 2B is a block diagram of another example RF generation system, in accordance with a number of embodiments of the present disclosure.

FIG. 2B shows an embodiment of an example RF generation system 250 including an RF generator 252, according to various embodiments of the disclosure. RF generation system 250 further includes a computer 254 and commands 256, which may include a series (e.g., one or more) of commands. For example, commands 256 may include commands for describing a pulsed waveform having specific pulse characteristics using a syntax recognized by RF generator 252.

RF generator 252 includes an interface 258, a digital shaper 260, a D/A converter 262, a pre-amplifier 265, a AGC amplifier 268, a filter 266, a power amplifier 270, a power sensor 272, and a control unit 274. In some embodiments, RF generator 252 includes a feedback loop 276. Further, AGC amplifier 268 and/or power amplifier 270 may be part of an amplification stage.

Commands 256 may be provided to RF generator 252 via interface (e.g., an interface similar to the interface described with reference to FIGS. 1A and 1B) 258. Commands 256 may include power levels and time span for each segment in the pulse span. Commands 256 are received at a digital shaper 260, which is configured to interpret the commands to generate a digital representation of a single-period pulsed waveform and to stich the single-period of the pulsed waveform into a continuous pulsed waveform. Digital shaper 260 outputs a bit stream representative of the digital pulsed waveform. D/A converter 262 generates an analog pulsed signal in response to the digital continuous pulsed waveform received from digital shaper 260. The analog pulsed signal may be received at control unit 274 and conveyed to AGC amplifier 268.

A RF signal (e.g., an RF carrier signal), generated via, for example, a direct digital synthesizer (DDS) or a crystal oscillator, is received at pre-amplifier 215 and conveyed to AGC amplifier 268. AGC amplifier 268 modulates the RF signal using the analog pulsing (modulating) signal and outputs a pulsed RF signal. The pulsed RF signal is filtered via filter 266, and the filtered RF signal is amplified via power amplifier 270 to output an amplified pulsed RF signal. The level of attenuation is controlled by a controlled feedback loop (i.e., including control block 224) 276, similar to as described above with reference to FIGS. 1A, 1, and 2A.

In the embodiments of FIGS. 2A and 2B, a user may program RF generator 202/252 to use a pulsing waveform having pulses of any shape via interface 208/258 by using commands 206/256. It will be appreciated that in the embodiments of FIGS. 2A and 2B, a user does not require an external signal generator for any waveform used to pulse the RF generator.

As mentioned above, conventional RF generators known to the inventors of this disclosure use a pulsed signal that has two states: high (on) and low (off). The pulsed/pulsing (modulating) signal is used to switch an RF signal on/off to generate an RF signal with the same pulsing pattern as the pulsed/pulsing signal.

Some embodiments relate, generally, to a pulsed RF generator that may receive and use a pulse stream having a waveform with more than two signal levels (i.e., more than just high and low). Such a pulsed signal is referred to herein as a "multi-step" pulsed signal. In some embodiments, the RF generator modulates the RF signal using the multi-step pulsed signal. It will be appreciated that any analog arbitrary waveform may be used with such embodiments of an RF generator. In some embodiments, the multi-step pulsed signal source is generated by signal generation equipment external to the pulsed RF generator.

Figure 3A:
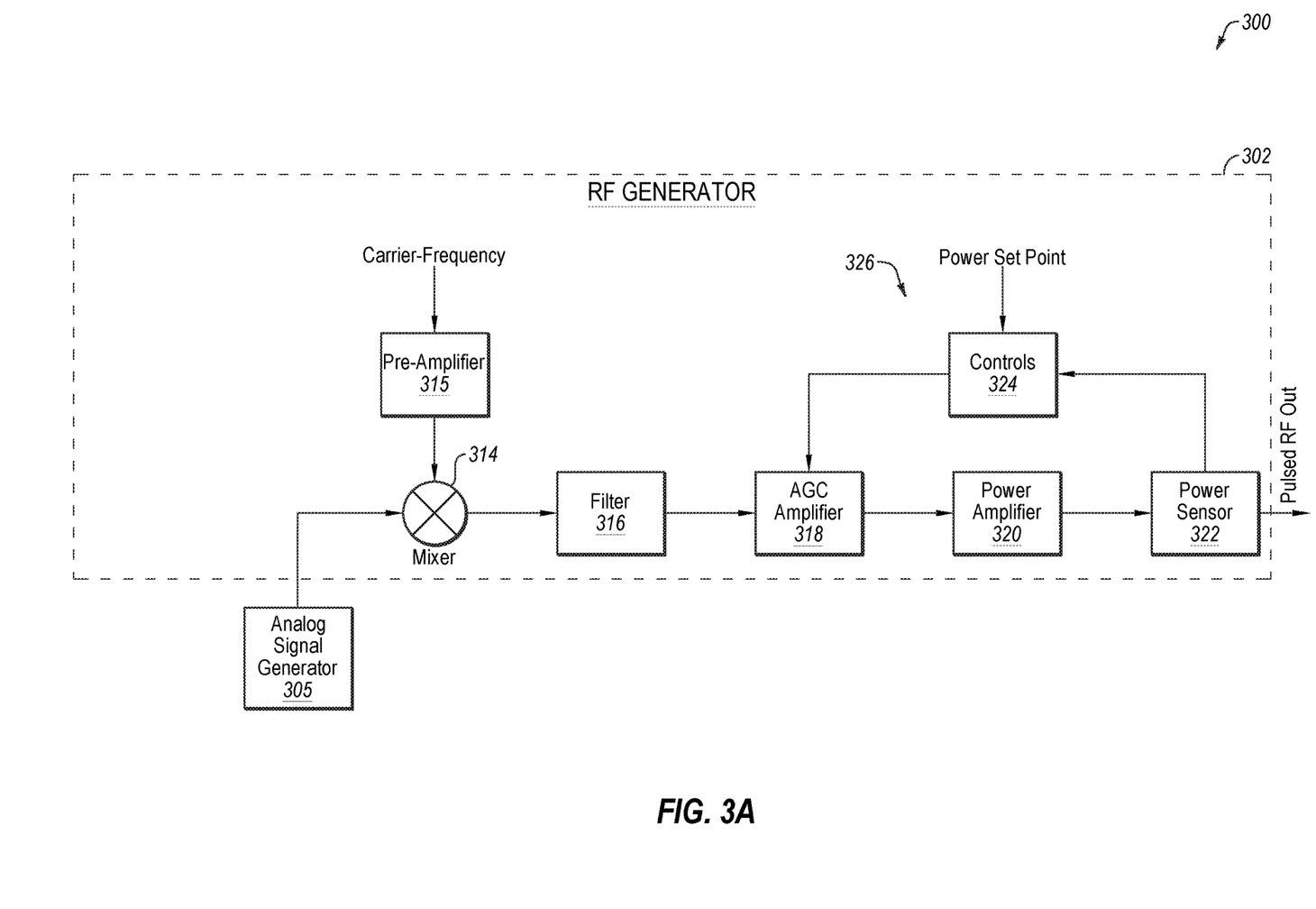
FIG. 3A is a block diagram of another example RF generation system, according to a number of embodiments of the present disclosure.

FIG. 3A shows an embodiment of an example RF generation system 300 including an RF generator 302, in accordance with various embodiments of the disclosure. RF generation system 300 further includes an analog signal generator 305 coupled to RF generator 302. RF generator 302 includes a mixer 314 and a pre-amplifier 315. RF generator 302 further includes a filter 316, a AGC amplifier 318, a power amplifier 320, a power sensor 322, and a control unit 324. In some embodiments, RF generator 302 includes feedback loop 326. Further, AGC amplifier 318 and/or power amplifier 320 may be part of an amplification stage.

In the embodiment of FIG. 3A, RF generator 302 may be configured to generate a pulsed RF signal in response to an analog multi-step and/or arbitrary pulsed signal. In a contemplated operation, an analog pulsed signal (e.g., with a multi-step and/or an arbitrary waveform) is output by analog signal generator 305 and received at mixer 314. Further, mixer 314 receives a RF signal (e.g., generated via a direct digital synthesizer (DDS) or a crystal oscillator) via pre-amplifier 315, and generates a pulsed RF signal by modulating the RF signal using the pulsed analog signal as a modulating signal. The power level of the pulsed RF signal is regulated to the requested power set point at each step or each level of the pulsed RF envelope. The set point is controlled by controlled feedback loop (i.e., including control unit 324) 326, similar to as described above with reference to FIGS. 1A, 1B, 2A and 2B.

Figure 3B:
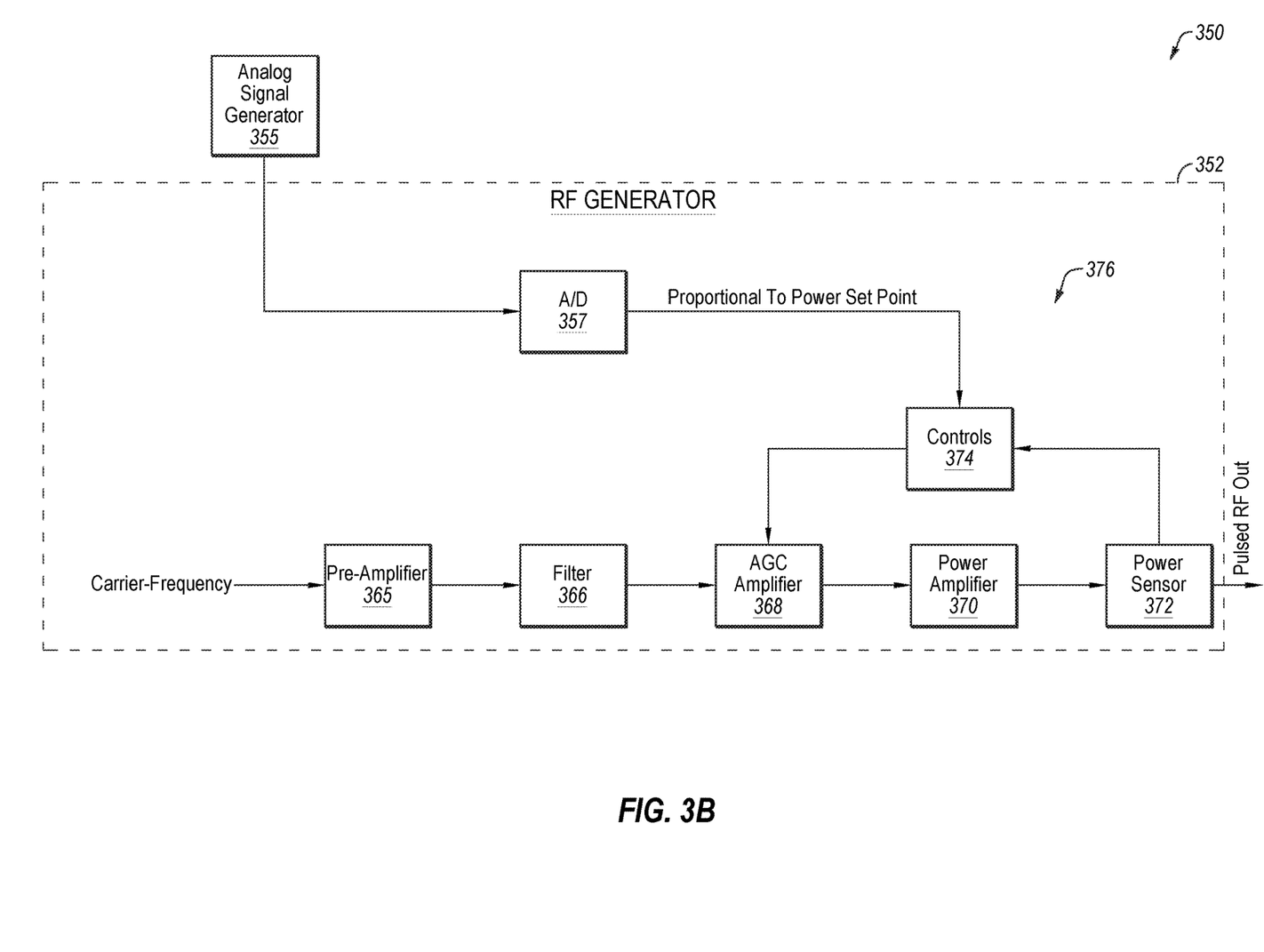
FIG. 3B is a block diagram of yet another example RF generation system, according to a number of embodiments of the present disclosure.

FIG. 3B shows an embodiment of another example RF generation system 350 including an RF generator 352, in accordance with various embodiments of the disclosure. RF generation system 350 further includes an analog signal generator 355 coupled to RF generator 352. RF generator 352 includes an analog-to-digital (A/D) converter 357, a pre-amplifier 365, and a filter 366. RF generator 352 further includes a AGC amplifier 368, a power amplifier 370, a power sensor 372, and control unit 374. In some embodiments, RF generator 352 includes a feedback loop 376. Further, AGC amplifier 368 and/or power amplifier 370 may be part of an amplification stage.

In a contemplated operation, a modulating signal with arbitrary waveform is output by analog signal generator 355 and received at A/D converter 357. In response to the modulating signal, A/D converter 357 generates a digital signal that is received at control unit 374 and conveyed to AGC amplifier 368. AGC amplifier 368 receives a RF signal (e.g., generated via a direct digital synthesizer (DDS) or a crystal oscillator) via pre-amplifier 365 and filter 366, and generates a pulsed RF signal by modulating the RF signal using the digital signal as a modulating signal. The power level of the pulsed RF signal is regulated to the requested power set point at each step or each level of the pulsed RF envelope. The set point is controlled by controlled feedback loop (i.e., including control unit 374) 376, similar to as described above with reference to FIGS. 1A, 1B, 2A, 2B, and 3A.

It will be appreciated that in the embodiment illustrated in FIG. 3A, an arbitrary analog signal is used by an RF generator to modulate an RF carrier to create an RF envelope that follows the arbitrary waveform envelope. Further, it will be appreciated that for embodiments disclosed with reference to FIGS. 1A, 1B, 2A, and 2B, external analog signal generation equipment may not be required to generate a modulating signal having a desired pulsed waveform. Also, it will be appreciated that for embodiments disclosed with reference to FIGS. 1A-3B, the RF generation systems enable modulating an RF signal with an arbitrary waveform and to accurately control the RF Peak Envelope Power (PEP).

Figure 4:
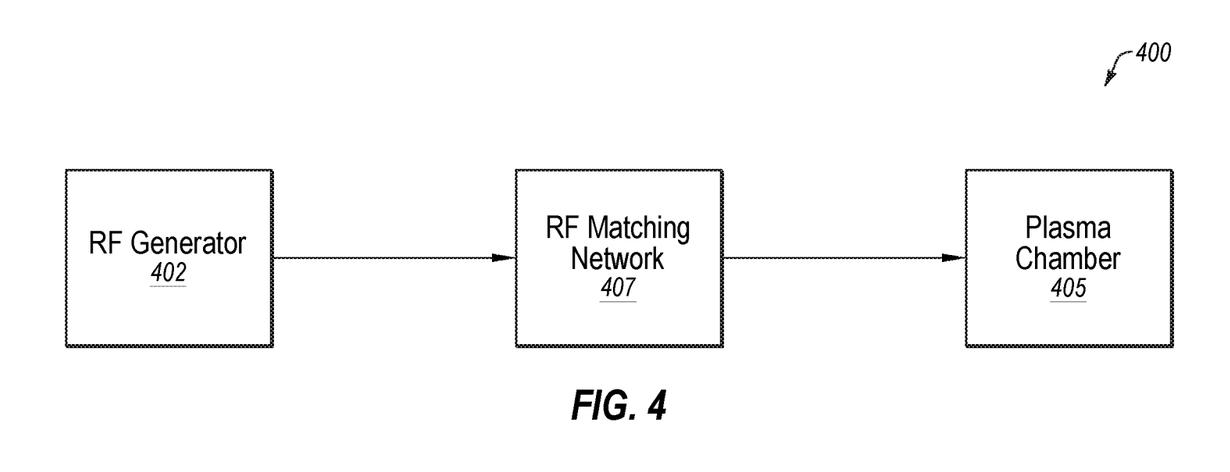
FIG. 4 depicts an example semiconductor manufacturing system, in accordance with one or more embodiments of the present disclosure.

Some embodiments relate to RF plasma generation, and more specifically, RF plasma excitation using a pulsed/pulsing RF signal generated according to one or more disclosed embodiments. FIG. 4 shows a simplified block diagram of an example semiconductor manufacturing system 400 configured for using RF plasma excitation. Semiconductor manufacturing system 400 includes an RF generator 402 (e.g., RF generator 102 of FIG. 1A, RF generator 152 of FIG. 1B, RF generator 202 of FIG. 2A, RF generator 252 of FIG. 2B, RF generator 302 of FIG. 3A, or RF generator 352 of FIG. 3B) configured to provide a pulsed RF signal to a plasma chamber 405 via an RF matching network 407 (e.g., to match the output impedance of the pulsed, or CW, RF generator to the impedance of the plasma chamber constituting the load to the RF generator and to maximize power transfer) for plasma excitation therein.

Figure 5:
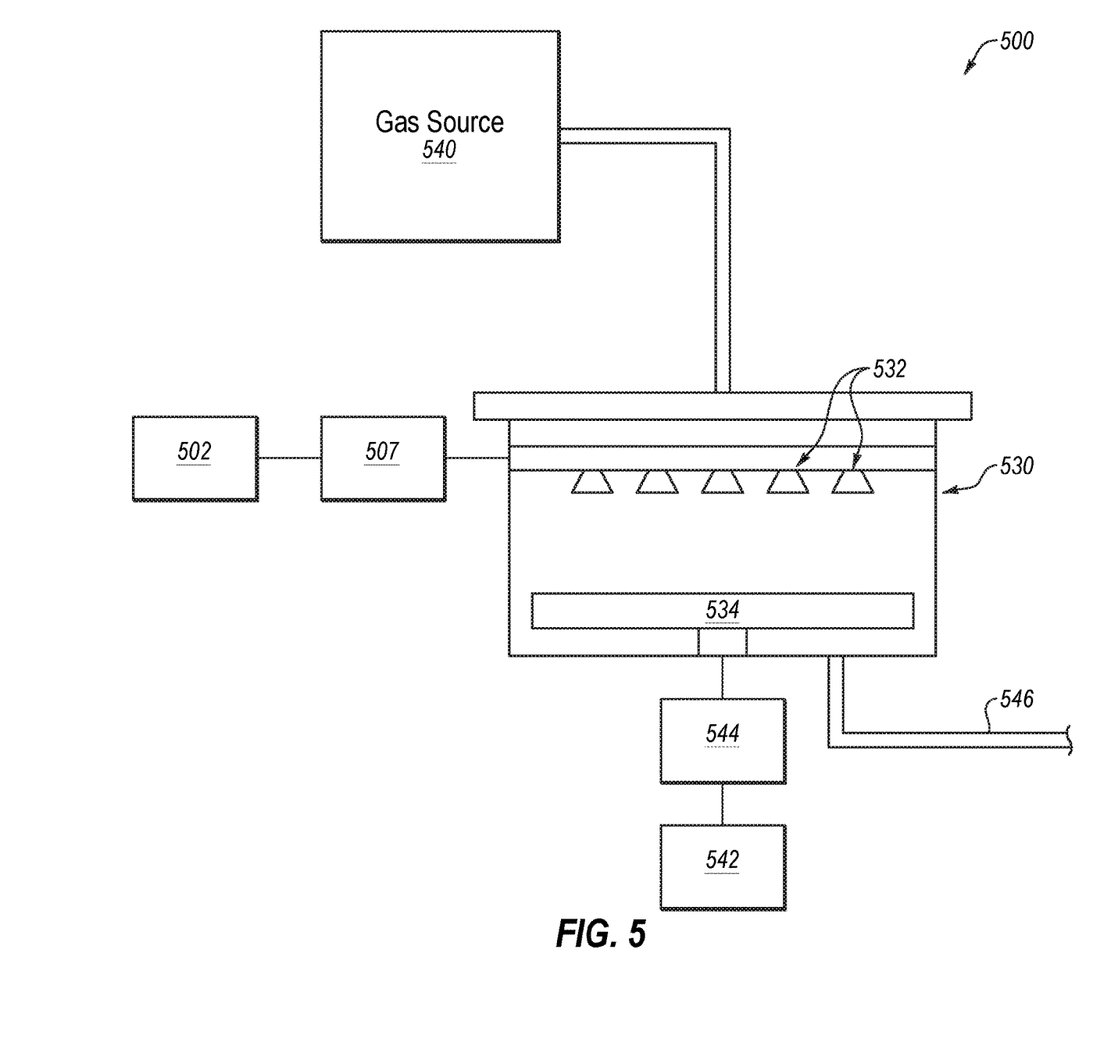
FIG. 5 depicts an example RF plasma generator, according to one or more embodiments of the present disclosure.
Figure 6A:
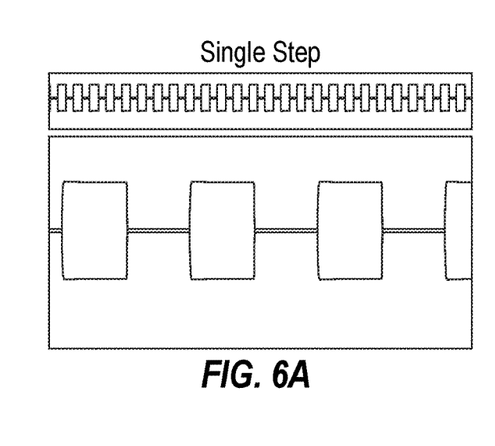
FIGS. 6A-6F depicts waveforms comprising pulse trains having various non-limiting examples of pulse waveforms, in accordance with various embodiments of the present disclosure.
Figure 6B:
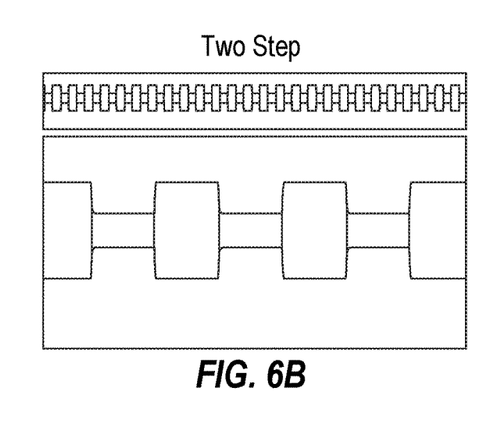
Figure 6C:
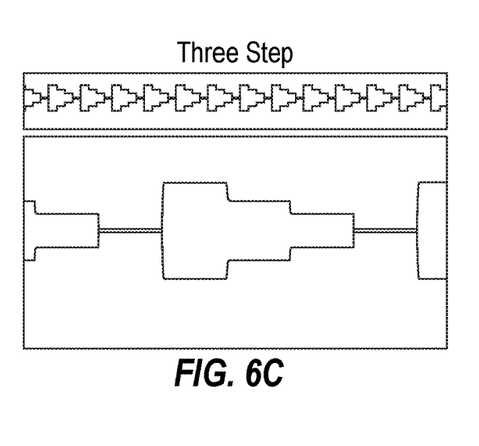
Figure 6D:
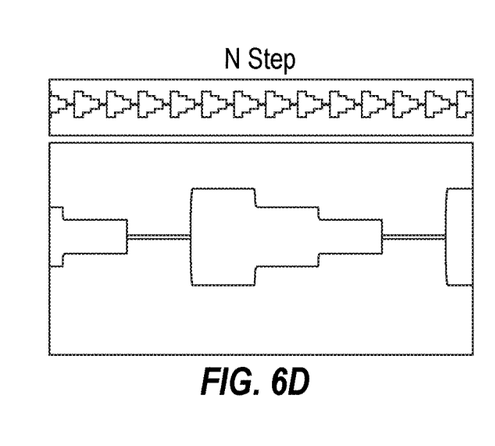
Figure 6E:
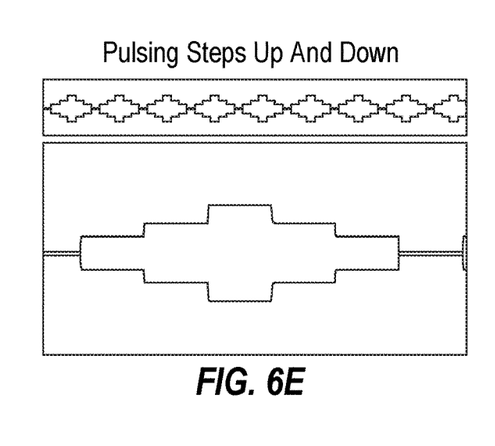
Figure 6F:
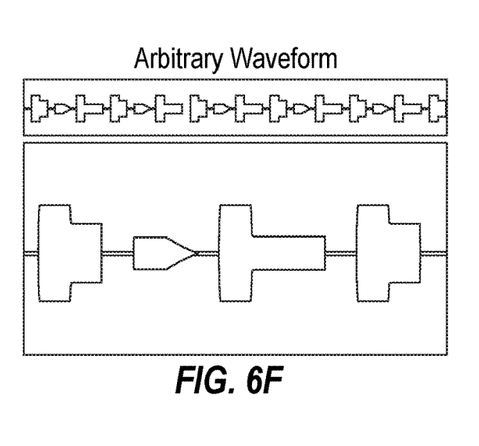

FIG. 5 shows an embodiment including a simplified example of an RF plasma generator 500 for deposition and/or etching in a semiconductor manufacturing process that uses pulsed RF signals generated in accordance with disclosed embodiments. RF plasma generator 500 includes an RF generator 502, a RF matching network 507, and an apparatus 530, which may include, for example, a deposition/etch apparatus. For example, RF generator 502 may include RF generator 102 of FIG. 1A, RF generator 152 of FIG. 1B, RF generator 202 of FIG. 2A, RF generator 252 of FIG. 2B, RF generator 302 of FIG. 3A, RF generator 352 of FIG. 3B, or RF generator 402 of FIG. 4. Apparatus 530 includes a number of showerheads/electrodes 532 and a chuck 534. RF plasma generator 500 further includes a gas source (e.g., a reactant gas source) 540, a RF bias generator 542, a RF matching network 544, and an exhaust line 546.

FIGS. 6A-6F show non-limiting example waveforms comprising pulse trains having various non-limiting examples of pulse waveforms. The waveform in FIG. 6A, designated "single-step," shows an example pulse train where each pulse exhibits one amplitude during its duty cycle. The waveform in FIG. 6B, designated "two-step," shows an example pulse train where a pulse exhibits two distinct amplitudes during its duty cycle. The waveform in FIG. 6C, designated "three-step," shows an example pulse where the pulse exhibits three distinct amplitudes during its duty cycle. The waveform in FIG. 6D, designated "N step," shows an example pulse where the pulse may exhibit N distinct amplitudes during its duty cycle (here it exhibits three amplitudes but it could exhibit, for example, 2, 4, 1, 5, 20 without limitation). The waveform in FIG. 6E, designated "pulsing steps up and down" shows an example pulse where the pulse exhibits N distinct amplitudes during the first half of its duty cycle (the step up half of the duty cycle) and N distinct amplitudes during the second half of its duty cycle (the step down half of the duty cycle). The waveform in FIG. 6F, designated "arbitrary waveform" shows an example of a user defined pulse train where the pulses each have a different arbitrary shape. More specifically, this example shows a balanced (equal portions of the duty cycle are assigned to each step) two-step pulse followed by a single step pulse with a ramp down, and then an imbalanced (unequal portions of the duty cycle are assigned to each step) two-step pulse. The arbitrary waveform that modulates the RF signal can also be of random nature, not necessary an N-step pulse, or ramped up or down.

Figure 7:
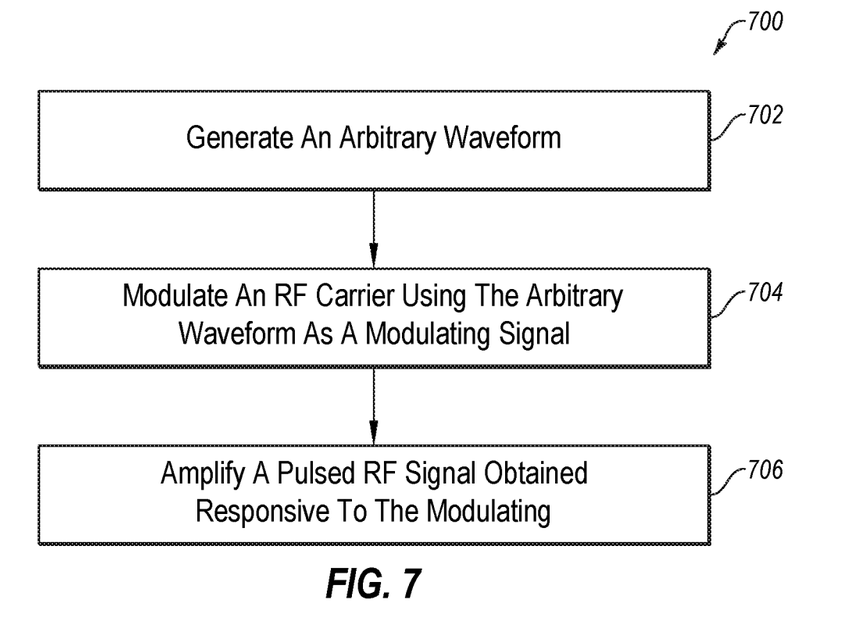
FIG. 7 is a flowchart of an example method of generating a pulsed RF signal, in accordance with various embodiments of the present disclosure.

FIG. 7 is a flowchart of an example method 700 of generating a pulsed RF signal, in accordance with various embodiments of the disclosure. Method 700 may be arranged in accordance with at least one embodiment described in the present disclosure. Method 700 may be performed, in some embodiments, by a device or system, such as RF generation system 100 of FIG. 1A, RF generation system 150 of FIG. 1B, RF generation system 200 of FIG. 2A, RF generation system 250 of FIG. 2B, RF generation system 300 of FIG. 3A, RF generation system 350 of FIG. 3B, semiconductor manufacturing system 400 of FIG. 4, RF plasma generator 500 of FIG. 5, or another device or system. Although illustrated as discrete blocks, various blocks may be divided into additional blocks, combined into fewer blocks, or eliminated, depending on the desired implementation.

Method 700 may begin at block 702, wherein an arbitrary waveform may be generated, and method 700 may proceed to block 704. For example, the arbitrary waveform may be generated via analog signal generator 305 of FIG. 3A or analog signal generator 355 of FIG. 3B.

At block 704, a RF carrier may be modulated using the arbitrary waveform, and method 700 may proceed to block 706. For example, the RF carrier may be modulated via a mixer (e.g., mixer 314 of FIG. 3A) or an AGC amplifier (e.g., AGC amplifier 368 of FIG. 3B).

At block 706, a pulsed RF signal obtained responsive to the modulation (i.e., at block 702) may be amplified. For example, the pulsed RF signal may be amplified via power amplifier 320 of FIG. 3A or power amplifier 370 FIG. 3B.

Modifications, additions, or omissions may be made to method 700 without departing from the scope of the present disclosure. For example, the operations of method 700 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, method 700 may also include one or more acts wherein samples of the amplified pulsed RF signal are sensed and an error signal is generated based on a comparison of samples of the amplified pulsed RF signal to pre-defined set points. Further, method 700 may include an act wherein a power level of the pulsed RF signal is attenuated in response to the error signal.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A radio frequency generation system, comprising:
   an analog signal generator configured to generate a single-period arbitrary waveform; and
   a radio frequency (RF) generator comprising:
      a shaper configured to receive the single-period arbitrary waveform, to generate a continuous waveform responsive to the single-period arbitrary waveform, and to output a stream representative of the continuous waveform;
      a modulator configured to receive the stream and an RF carrier, and generate a pulsed RF signal responsive to the continuous waveform and the RF carrier;
      an amplification stage configured to amplify the pulsed RF signal; and
      a feedback control loop configured to, for each pulsed RF step of the amplified pulsed RF signal:
         control a set point;
         compare a sample of the amplified pulsed RF signal to the set point to generate an error signal; and
         attenuate a power level of the amplified pulsed RF signal in response to the error signal.

2. The radio frequency generation system of claim 1, wherein the single-period arbitrary waveform comprises an analog multi-step signal, an arbitrary pulsed signal, or a combination thereof.

3. The radio frequency generation system of claim 1, wherein the RF generator further comprises an attenuator coupled between the modulator and the amplification stage and configured to attenuate the power level of the pulsed RF signal in response to the error signal generated via the feedback control loop.

4. The radio frequency generation system of claim 3, wherein the attenuator comprises an automatic gain control (AGC) amplifier coupled between the modulator and a power amplifier of the amplification stage.

5. The radio frequency generation system of claim 3, wherein the RF generator further comprises a power sensor configured to sample the amplified pulsed RF signal to generate the sample of the amplified pulsed RF signal.

6. The radio frequency generation system of claim 1, wherein the modulator comprises a mixer configured to receive the RF carrier and the stream and to modulate the RF carrier using the continuous waveform.

7. The radio frequency generation system of claim 1, wherein the modulator comprises an automatic gain control (AGC) amplifier configured to receive the RF carrier and the stream and to modulate the RF carrier using the continuous waveform.

8. The radio frequency generation system of claim 1, wherein the RF generator further comprises an analog-to-digital (A/D) converter coupled between the analog signal generator and the shaper and configured to generate a digital signal in response to the single-period arbitrary waveform.

9. A method of generating a pulsed radio frequency (RF) signal, comprising:
   generating a single-period arbitrary waveform;
   generating a continuous waveform responsive to the single-period arbitrary waveform;
   modulating an RF carrier using the continuous waveform as a modulating signal;
   amplifying a pulsed RF signal obtained responsive to the modulating; and
   for each pulsed RF step of the amplified pulsed RF signal, regulating a power level of the amplified pulsed RF signal, wherein the regulating the power level of the amplified pulsed RF signal for each pulsed RF step comprises:
      comparing a sample of the amplified pulsed RF signal to a set point to generate an error signal; and
      attenuating the power level of the amplified pulsed RF signal in response to the error signal.

10. The method of claim 9, wherein modulating comprises modulating the RF carrier via a mixer or an automatic gain control (AGC) amplifier.

11. The method of claim 9, wherein generating the single-period arbitrary waveform comprises generating the single-period arbitrary waveform via an analog signal generator external to an RF generator for generating the pulsed RF signal.

12. The method of claim 11, wherein generating the continuous waveform comprises converting the single-period arbitrary waveform into a digital signal representative of the continuous waveform prior to modulating the RF carrier.

13. A radio frequency generation system comprising:
   a radio frequency (RF) generator including:
      a shaper configured to generate a continuous waveform responsive to a single-period arbitrary waveform;
      a modulator configured to output a pulsed radio frequency (RF) signal by modulating an RF carrier using the continuous waveform as a modulating signal;
      a power amplifier configured to amplify the pulsed RF signal; and
      a feedback control loop coupled to the power amplifier and configured to, for each pulsed RF step of the amplified pulsed RF signal:
         control a set point;
         generate an error signal at least partially based on a comparison of the pulsed RF step of the amplified pulsed RF signal to the set point; and
         attenuate a power level of the amplified pulsed RF signal at least partially based on the error signal.

14. The radio frequency generation system of claim 13, wherein the RF generation system comprises an analog signal generator external to the RF generator and configured to generate the single-period arbitrary waveform.

15. The radio frequency generation system of claim 13, wherein the feedback control loop includes a control unit configured to generate the error signal.

16. The radio frequency generation system of claim 13, further comprising an analog-to-digital (A/D) converter coupled between an analog signal generator and the shaper to generate a digital signal representative of the single-period arbitrary waveform.

17. The radio frequency generation system of claim 13, wherein the modulator comprises a mixer or an automatic gain control (AGC) amplifier.

18. The radio frequency generation system of claim 13, wherein the RF generator further comprises an attenuator configured to:
   receive the pulsed RF signal from the modulator and the error signal from the feedback control loop; and
   modify the attenuation applied to the pulsed RF signal based on the error signal.

* * * * *